United States Patent
Smith et al.

(10) Patent No.: US 10,323,747 B2
(45) Date of Patent: Jun. 18, 2019

(54) PISTON RING AND METHOD FOR MANUFACTURING A PISTON RING

(71) Applicant: MAHLE International GmbH, Stuttgart (DE)

(72) Inventors: Thomas J. Smith, Muskegon, MI (US); Marc W. Benjamin, Saginaw, MI (US); Andrea C. Paul, Spring Lake, MI (US)

(73) Assignee: MAHLE International GmbH, Stuttgart (DE)

( * ) Notice: Subject to any disclaimer, the term of this patent is extended or adjusted under 35 U.S.C. 154(b) by 46 days.

(21) Appl. No.: 15/471,086

(22) Filed: Mar. 28, 2017

(65) Prior Publication Data
US 2018/0283553 A1    Oct. 4, 2018

(51) Int. Cl.
*B23P 15/06* (2006.01)
*F16J 9/26* (2006.01)
*B24C 1/06* (2006.01)
*C23C 14/02* (2006.01)
*C23C 14/06* (2006.01)
*C23C 14/24* (2006.01)
*C23C 14/58* (2006.01)
(Continued)

(52) U.S. Cl.
CPC ............... *F16J 9/26* (2013.01); *B23P 15/06* (2013.01); *B24C 1/06* (2013.01); *C23C 8/02* (2013.01); *C23C 14/028* (2013.01); *C23C 14/0605* (2013.01); *C23C 14/0611* (2013.01); *C23C 14/0641* (2013.01); *C23C 14/24* (2013.01); *C23C 14/588* (2013.01); *C23C 14/5886* (2013.01); *C23C 28/042* (2013.01); *C23C 28/044* (2013.01)

(58) Field of Classification Search
CPC ..... F16J 9/26; C23C 14/0611; C23C 14/0641; C23C 14/24; C23C 14/028; C23C 14/5886; B23P 15/06; B24C 1/06
See application file for complete search history.

(56) References Cited

U.S. PATENT DOCUMENTS

| 2,422,431 A | 6/1947 | Melrose |
| 3,556,747 A | 1/1971 | Hyde et al. |

(Continued)

FOREIGN PATENT DOCUMENTS

| EP | 1 783 349 A1 | 5/2007 |
| JP | 2005-001088 A | 1/2005 |
| JP | 2006-144100 A | 6/2006 |

OTHER PUBLICATIONS

Adoberg, Eron et al. "The effect of surface pre-treatment and coating post-treatment to the properties of TiN coatings." Estonian Journal of Engineering, 2012, 18, 3, pp. 185-192.

*Primary Examiner* — Jun S Yoo
(74) *Attorney, Agent, or Firm* — Collard & Roe, P.C.

(57) ABSTRACT

A piston ring that is pre-treated by grit blasting to a defined roughness, followed by PVD coating with a metal nitride to a thickness of at least 10 μm, leaving peaks and valleys in the coated piston ring. The coated piston ring is then lapped to remove the peaks without penetrating the coating, so that valleys and plateaus remain in the coated surface. The resulting piston ring exhibits superior coating retention due to the increased surface area created by the grit blasting, and yet also superior performance, as the cavities remaining increase the porosity of the coating and thus enhance the lubrication of the ring.

8 Claims, 6 Drawing Sheets

(51) Int. Cl.
*C23C 8/02* (2006.01)
*C23C 28/04* (2006.01)

(56) References Cited

U.S. PATENT DOCUMENTS

| | | | |
|---|---|---|---|
| 4,077,637 A | | 3/1978 | Hyde et al. |
| 4,106,782 A | | 8/1978 | Hyde et al. |
| 5,605,741 A | | 2/1997 | Hite et al. |
| 5,702,387 A | * | 12/1997 | Arts .................. A61B 18/1402 |
| | | | 606/45 |
| 6,739,238 B2 | | 5/2004 | Ushijima et al. |
| 6,886,521 B2 | | 5/2005 | Hamada et al. |
| 7,033,643 B2 | | 4/2006 | Sugita et al. |
| 7,086,362 B2 | | 8/2006 | Mabuchi et al. |
| 7,156,061 B2 | | 1/2007 | Matsui et al. |
| 7,341,648 B2 | | 3/2008 | Issler |
| 8,123,227 B2 | | 2/2012 | Kawanishi et al. |
| 8,722,197 B2 | | 5/2014 | Maurin-Perrier et al. |
| 2002/0081251 A1 | * | 6/2002 | He ........................ B01J 23/56 |
| | | | 427/450 |
| 2013/0043659 A1 | * | 2/2013 | Ito ............................ F16J 9/20 |
| | | | 277/443 |
| 2013/0143058 A1 | | 6/2013 | McCrea et al. |
| 2014/0165783 A1 | | 6/2014 | Monk et al. |
| 2014/0165826 A1 | * | 6/2014 | Baerenreuter ........... F16J 9/062 |
| | | | 92/172 |
| 2014/0217677 A1 | | 8/2014 | Smith et al. |
| 2014/0234549 A1 | | 8/2014 | Smith et al. |
| 2015/0111058 A1 | * | 4/2015 | Thompson ................ C23C 4/18 |
| | | | 428/556 |
| 2016/0312891 A1 | * | 10/2016 | Kantola ................... C25D 9/04 |

* cited by examiner

PISTON RING AND METHOD FOR MANUFACTURING A PISTON RING

BACKGROUND OF THE INVENTION

1. Field of the Invention

This invention relates to a piston ring that is coated with a deposition process and typically a metal nitride coating. In particular, the invention relates to a piston ring that is pre-treated with grit blasting to roughen the face and chamfer surfaces of the ring, and then coated via a PVD process with a metal nitride or other coating. The pre-treating increases adhesion of the coating to prevent chipping and flaking during high pressure events, such as LSPI (low speed pre-ignition).

2. The Prior Art

Pre-treating piston rings via grit blasting has been used in the past to create a better surface to receive a coating. However, the goal with prior piston rings was to create a surface to which the coating would adhere, yet create a smooth coated surface, to reduce friction with the cylinder walls. For example, U.S. Pat. No. 3,556,747 discloses treating the piston ring via grit blasting prior to coating via plasma arc spraying and machining to a smooth finish.

However, particularly with smaller turbo charged engines, LSPI situations can occur, which can lead to increased stress on the engine and consequently on the piston rings. Under this stress, the thin PVD coating can become chipped, leading to increased wear on the cylinder and piston rings.

SUMMARY OF THE INVENTION

It is therefore an object of the present invention to provide a coated piston ring that exhibits superior coating retention and durability, yet also retains good lubrication to avoid scuffing on the cylinder liner walls.

This object is accomplished by a piston ring that is pre-treated by grit blasting to a defined roughness, followed by PVD coating with a metal nitride or diamond like carbon (DLC) to a thickness of at least 10 μm, leaving peaks and valleys in the coated piston ring. The coated piston ring is then lapped to remove the peaks without penetrating the coating, so that valleys and plateaus remain in the coated surface. The resulting piston ring exhibits superior coating retention due to the increased surface area created by the grit blasting, yet also superior performance. The cavities remaining increase the porosity of the coating and thus enhance the lubrication of the ring, reducing potential for wear, scuff and spalling.

During high pressure events such as LSPI, explosions in the combustion chamber can lead to very high pressure in the space between the cylinder liner and the piston rings. This pressure situation can cause severe degradation in traditional coatings on the rings. The method of the present invention can minimize or prevent this degradation.

The piston ring is preferably grit blasted to achieve a surface roughness average $R_a$ of 0.3-1.5. The grit blasting preferably takes place at angles of 35° and 55° to the face surface of the piston ring. These angles provide the best roughness characteristics, such as the formation of pockets, yet also achieve a uniformity of the roughness throughout the piston face and chamfer.

The optimal roughness is achieved with a with a grit size of between 120 and 220, and preferably with a mixture of 120, 180, and 220 grit. The grit can be of any suitable material such as $Al_2O_3$.

The piston ring can also be treated with a hardening process prior to roughening and coating. This could be either case hardening or through hardening, such as by nitriding the ring.

The coating could be any suitable coating but is preferably a metal nitride, such as CrN or TiN, or a diamond-like carbon coating (DLC) or carbon film, which exhibits good adhesion in the process according to the invention.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
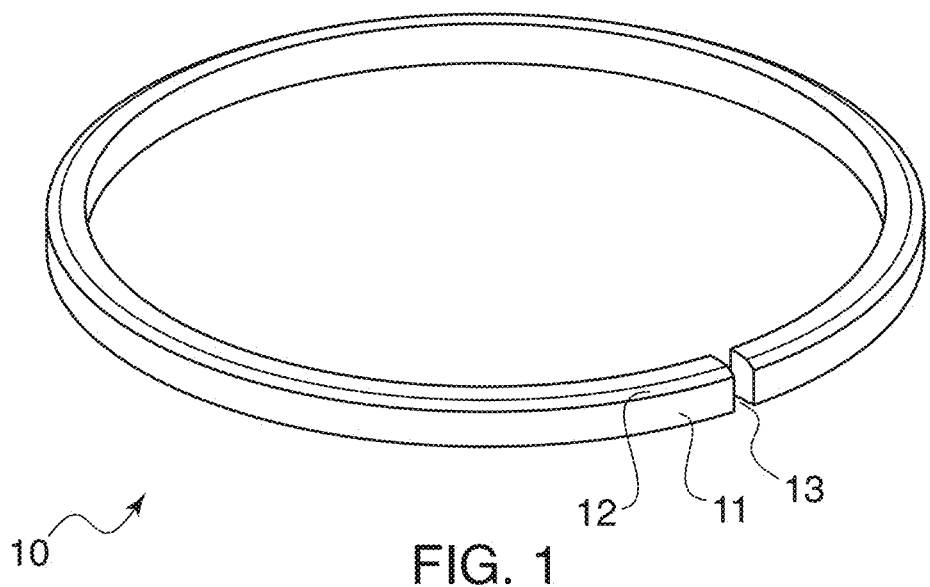
FIG. 1 shows a piston ring having a gap and a chamfered surface.
Figure 2:
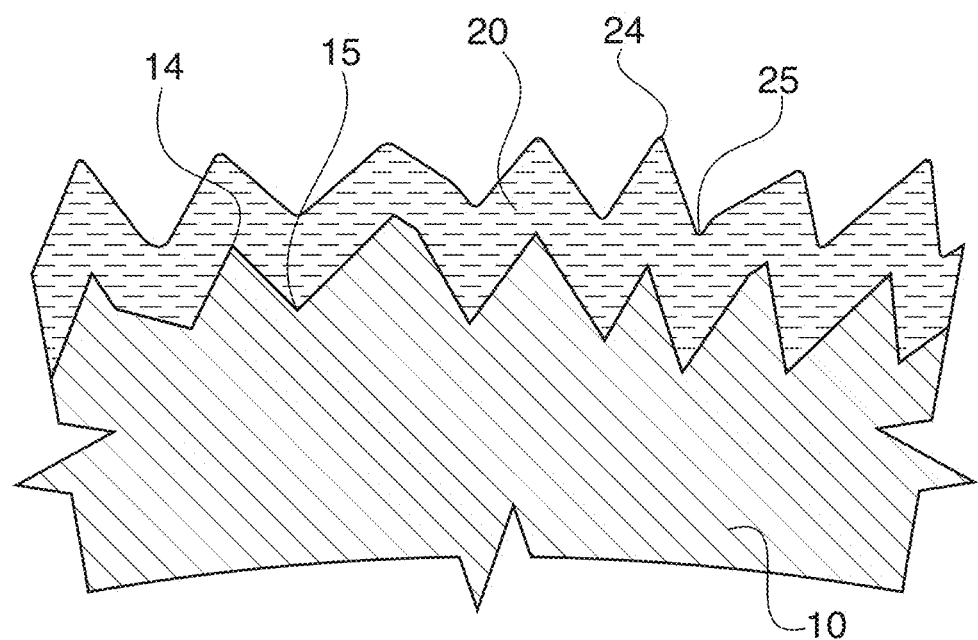
FIG. 2 shows the face surface of the ring after grit blasting and coating.
Figure 3:
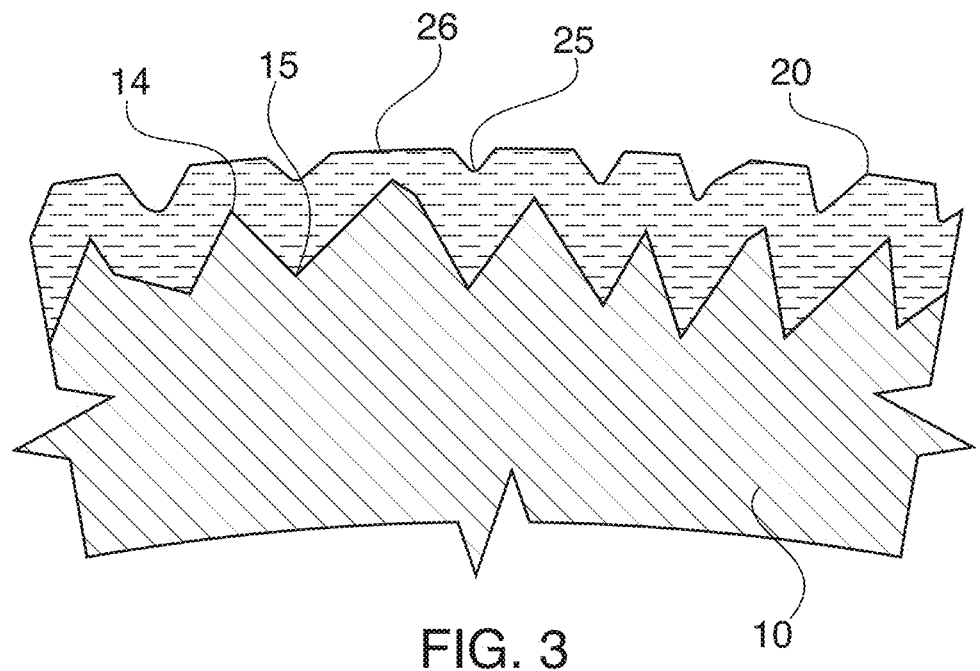
FIG. 3 shows the face surface of the ring after lapping.

Referring now in detail to the drawings, FIG. 1 shows a piston ring 10 according to the invention. Ring 10 has a face surface 11, a chamfer surface 12, and a gap 13. Face surface 11 and chamfer surface 12 are treated with grit blasting, generally with a grit of various sizes, to lead to a surface having a series of peaks 14 and valleys 15, as shown in FIGS. 2 and 3. A coating 20 is applied over the grit-blasted surface via physical vapor deposition (PVD) to a desired depth. Peaks 24 and valleys 25 are also in the coating. Then, as shown in FIG. 3, the peaks 24 of the coating are cut off via a lapping process to form plateaus 26 separated by valleys 25. By finding the optimal grit combinations and blasting angles, the piston ring of the present invention can be manufactured to exhibit high durability during high pressure situations, yet also exhibit high lubrication properties due to the porous nature of the coating.

Figure 4:
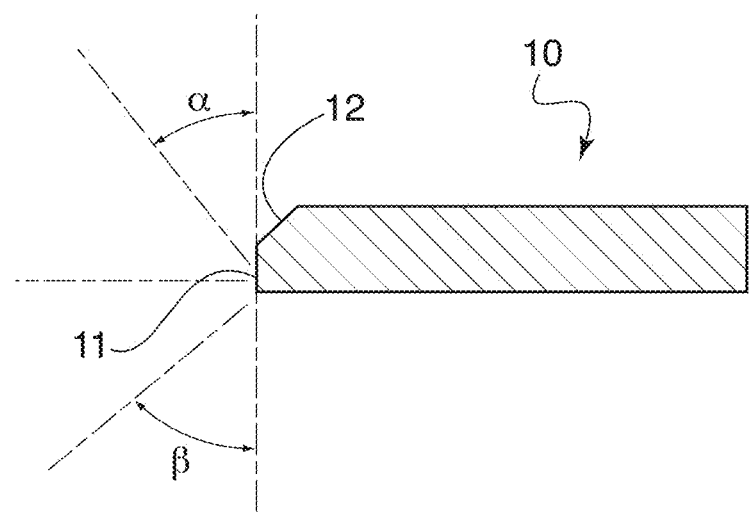
FIG. 4 shows the blast angles used during the grit blasting step of the invention.
Figure 6:
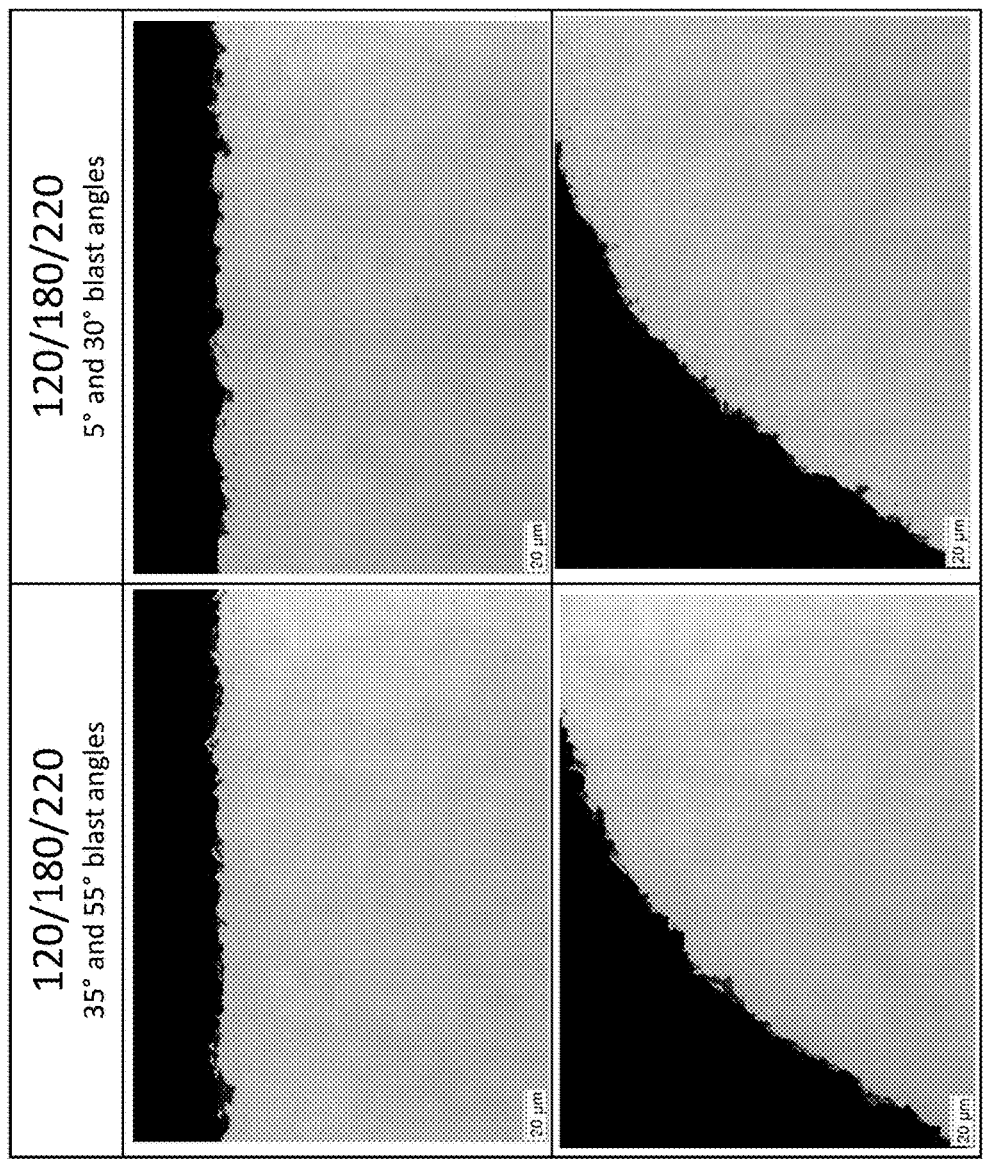
FIG. 6 shows photographs showing the surface roughness using 35° and 55° blast angles as compared to 5° and 30° blast angles.

The preferred angles for grit blasting are shown in FIG. 4. Preferably an angle α of 35° to the face surface 12, and/or an angle β of 55° to the face surface 12 are used for the grit blasting process. These angles are preferred over smaller and larger angles, as they give a more regular surface effect, and allow for the creation of pockets in the surface of the ring. These pockets increase lubrication retention. A comparison of blast angles is shown in FIG. 6, where using identical grit, blast angles of 35° and 55° are compared to blast angles of 5° and 30° for the face surfaces (upper quadrants) and chamfer surfaces (lower quadrants) of a piston ring according to the invention. As shown in FIG. 6, the blast angles of 35° and 55° show overall higher regularity in the surface, yet also allow for the creation of pockets in the surfaces.

Figure 5:
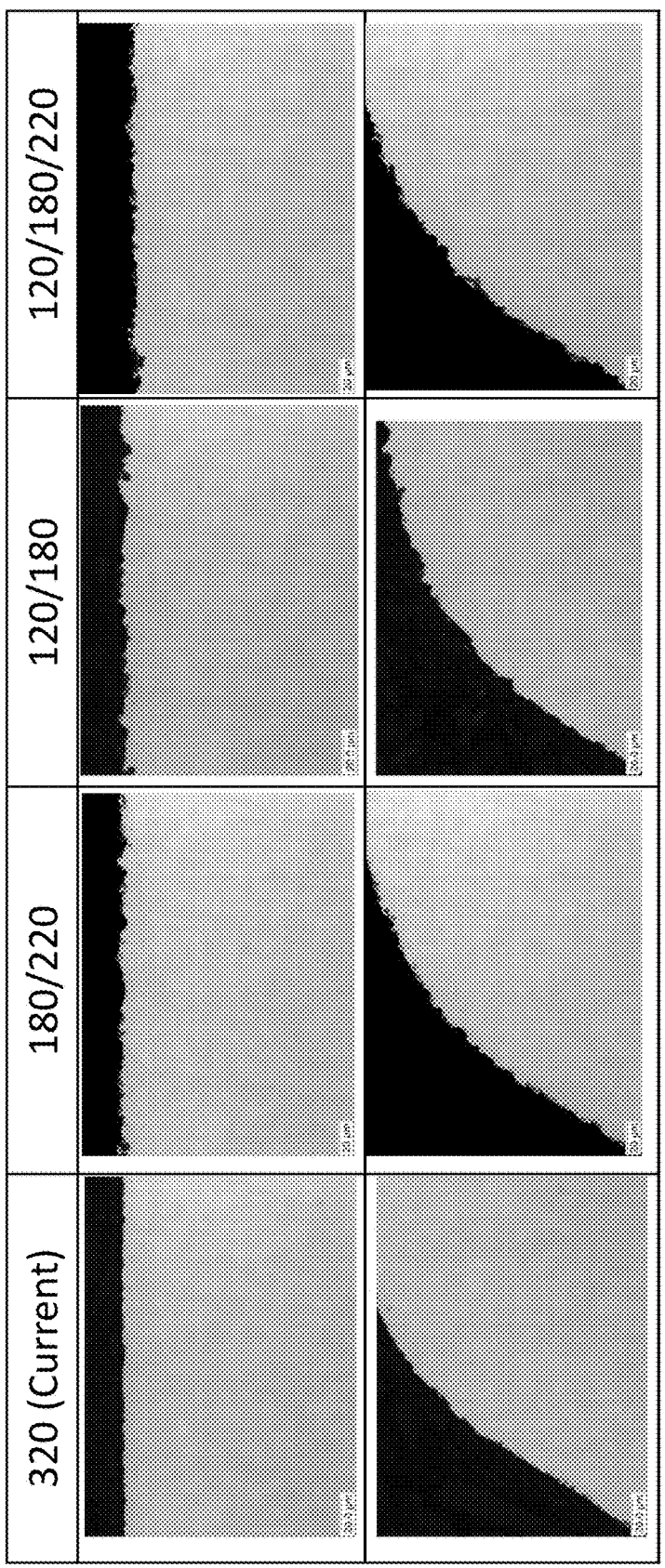
FIG. 5 shows photographs showing the surface roughness using grit of different sizes and combinations.

FIG. 5 shows a comparison of surface textures of the face surface (upper row) and chamfer surface (lower row) for various grit sizes and combinations. After experimentation, it was determined that a combination of grit sizes of 120/180/220 grit leads to the best surface regularity and roughness. The grit is used in a 1:1:1 ratio. The use of 120 grit media increases the overall roughness of the surface, while greater regularity is achieved with the addition of 220 grit media. The commonly used 320 grit media is shown for comparison. As can be seen, using grit between 120-180 leads to significantly rougher surfaces than when 320 grit is used.

Figure 7B:
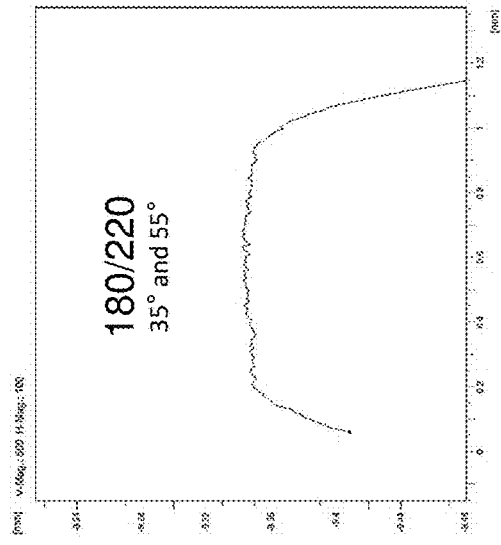
FIGS. 7a-7e show comparisons of a surface treated with grits of various sizes and combinations, along with various blast angles.
Figure 7D:
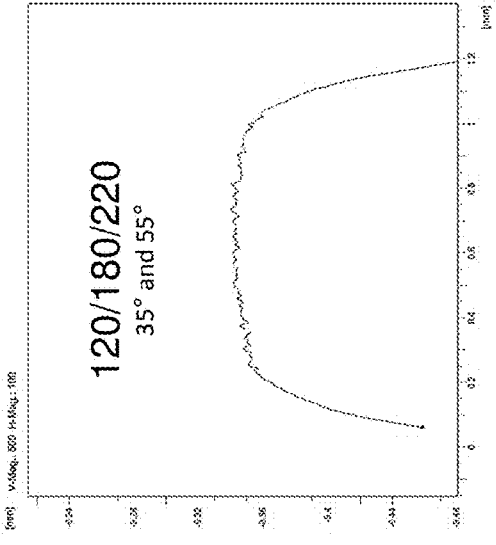
Figure 7A:
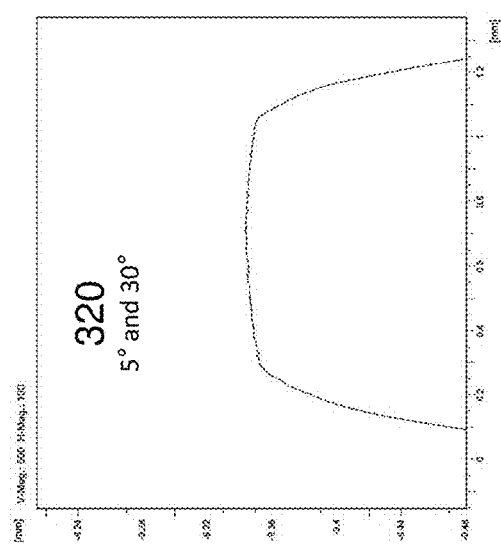
Figure 7C:
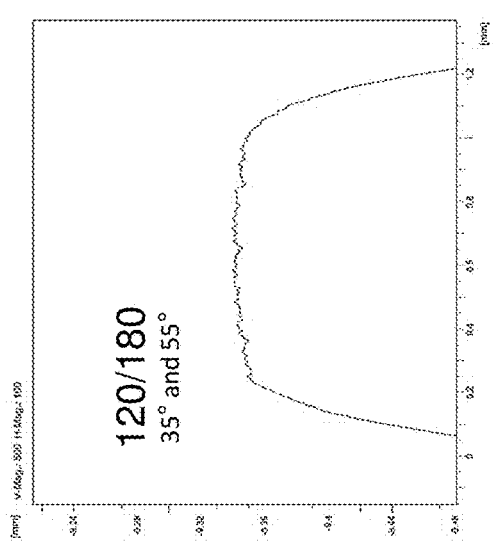
Figure 7E:
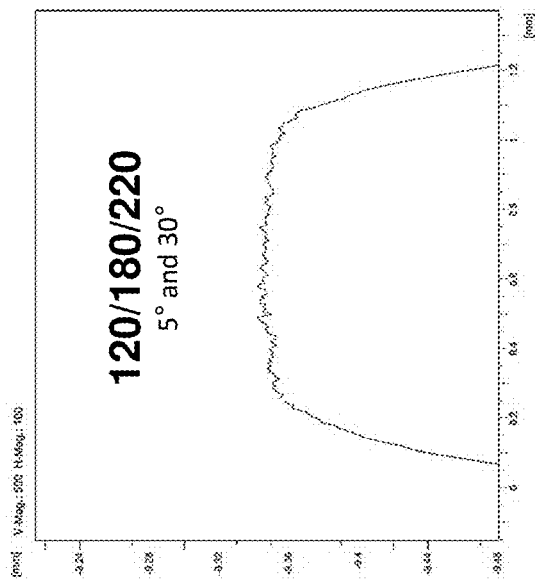

FIGS. 7a-7e show comparisons of a surface treated with grits of various sizes and combinations, along with various blast angles. FIG. 7a shows the use of 320 grit and 5° and 30° blast angles. The treated surface is relatively smooth. FIG. 7b shows treatment with 180/220 grit at 35° and 55° blast angles. This leads to significantly rougher texture on the surface. In comparison, FIG. 7c uses the same blast angles, but increases the grit size to 120/180. This leads to an even rougher surface but with uneven peaks and valleys. The preferred 120/180/220 grit combination, with the preferred angles of 35° and 55° is shown in FIG. 7d. Here, the surface is uniformly roughened. Changing the blast angles to 5° and 30°, as shown in FIG. 7e, leads to less uniformity in the roughness.

Table 1 below illustrates the comparative average roughness using the various grit sizes and blast angles.

TABLE 1

|  | Face | | Chamfer | |
| --- | --- | --- | --- | --- |
|  | $R_a$ | $R_z$ | $R_a$ | $R_z$ |
| 320 5° and 30° | 0.30 | 2.12 | 0.83 | 5.19 |
| 180/220 35° and 55° | 0.87 | 6.66 | 1.02 | 6.81 |
| 120/180 35° and 55° | 1.02 | 6.99 | 1.22 | 8.22 |
| 120/180/220 35° and 55° | 0.85 | 6.28 | 1.26 | 7.91 |
| 120/180/220 5° and 30° | 1.19 | 9.05 | 1.13 | 5.72 |

As can be seen above, the combination of 120/180/220 grit and the 35° and 55° blast angles gives the greatest average roughness $R_a$ for the chamfer, and second greatest mean $R_z$, but yields a significantly lesser roughness in the face surface. This is optimal to create the best profile for performance of the rings. If the face surface is too rough, scuffing or bore marking of the cylinder liner can occur. However, for automotive applications, the removal of peaks through the lapping operation should be sufficient to eliminate this problem, as is supported by the results of the first engine test.

In addition, having a slightly smoother face surface is optimal for uniformity of coating thickness and minimization of lapping time. High face roughness will require more lapping to remove during manufacturing, adding cost and resulting in a coating which fluctuates between thick and thin—thick in valleys, thin where peaks have been lapped off. This might also require increased coating thickness in order for the thin spots to be thick enough, which would add further time and cost to the manufacturing process.

As shown in FIG. 5, using the 120/180/220 grit leads to more surface features than the 120/180 grit in both the face and chamfer region, and these features provide superior mechanical locking strength due to the increased roughness of the substrate while still providing for a manufacturing-friendly process.

Higher chamfer roughness is ideal, since that is the area where coating failure often starts, and since the chamfer does not contact the ring face, increased roughness is not as much of a concern for scuffing etc., but does have the potential to further improve mechanical locking features of the coating.

The rings of the present invention were also tested to see if the grit blasting had any significant effect on light tightness, ring tension and the size of the free gap in the ring. 88.1 mm rings and 92.5 mm prototype pieces were tested. Piston rings having the variations of grit blasting as shown in FIGS. 7a-7e exhibited suitable light tightness and acceptable tension and ring gap sizes that varied only slightly from an untreated ring. Thus, the addition of grit up to 120 in size had negligible effects on the ring free gap and tension and no adverse effects on light tightness, yet had significant effects on the surface roughness of the ring face and chamfer, giving the beneficial effects discussed above.

TABLE 2

| Grit | Free gap (mm) | CD Tension (N) | Light Tightness |
| --- | --- | --- | --- |
| None | 12.64 | 23.5 | good |
| 320 | 12.51 | 23.5 | good |
| 180/220 | 12.56 | 23.1 | good |
| 120/180 | 12.17 | 22.6 | good |
| 120/180 (after 250° C.) | 12.18 | 22.8 | good |
| 120/180/220 (35° and 55°) | 11.97 | 22.3 | good |
| 120/180/220 (5° and 30°) | 12.56 | 22.2 | good |

Table 3 illustrates tests run on 88.1 mm piston rings and 92.5 mm prototypes that were treated with grit blasting and subjected to heating for 5 hours at 250° C. to illustrate furnace conditions of a PVD chamber. As shown in the table this treatment had a negligible effect on the ring characteristics.

TABLE 3

| Diameter (mm) | Condition | Free gap (mm) | CD Tension (N) | Light Tightness |
| --- | --- | --- | --- | --- |
| 88.1 | 120/180 Blasted | 12.17 | 22.6 | good |
|  | After 250° C. for 5 hrs | 12.18 | 22.8 | good |
| 92.5 | 120/180 Blasted | 14.18 | 21.4 | good |
|  | After 250° C. for 5 hrs | 14.22 | 21.4 | good |

In addition, tests were conducted in an internal combustion engine, using the rings according to the invention. A minimum of 400 LSPI events occurred in the engine, with an average event pressure of about 190 bar. The rings according to the invention exhibited a 50% minimum area reduction in running face coating loss as compared to a standard ring treated with only 320 grit, and exhibited no scuffing or bore marking on the cylinder liner. In the exemplary form the testing has exhibited 93% reduction in coating loss achieved, demonstrating a significant improvement in adhesion strength.

Accordingly, while only a few embodiments of the present invention have been shown and described, it is obvious that many changes and modifications may be made thereunto without departing from the spirit and scope of the invention.

What is claimed is:

1. A method for manufacturing a piston ring, comprising:
   providing a piston ring base having a face surface, a chamfer surface and a gap;
   grit blasting the face surface and chamfer surface to create a roughened texture having an average surface roughness Ra of 0.3-1.5 μm;
   depositing a coating on the roughened face surface and chamfer surface via physical vapor deposition; and
   lapping the coating to remove peaks in the surfaces without penetrating the coating, so that the coated surfaces contain plateaus and valleys.

2. The method according to claim 1, wherein the grit blasting is applied with a grit size of between 120 and 220.

3. The method according to claim 2, wherein the grit is formed from a mixture of 120, 180 and 220 grit.

4. The method according to claim 1, wherein the grit blasting takes place at angles of 35° and 55° to the face surface of the piston ring.

5. The method according to claim 1, wherein the coating is applied at a thickness of at least 15 μm.

6. The method according to claim 1, wherein the coating is a metal nitride.

7. The method according to claim 1, wherein the coating is a diamond-like carbon (DLC) coating.

8. The method according to claim 1, further comprising hardening the piston ring prior to grit blasting via a case hardening or through hardening process.

* * * * *